United States Patent [19]
Harrer

[11] Patent Number: 6,091,304
[45] Date of Patent: Jul. 18, 2000

[54] FREQUENCY BAND SELECT PHASE LOCK LOOP DEVICE

[75] Inventor: James Richard Harrer, San Diego, Calif.

[73] Assignee: LG Information & Communications, Ltd., Seoul, Rep. of Korea

[21] Appl. No.: 09/158,289

[22] Filed: Sep. 22, 1998

[51] Int. Cl.[7] .............................. H03L 7/093; H03L 7/099
[52] U.S. Cl. .................................. 331/10; 331/16; 331/17; 331/36 C; 331/167; 331/177 V
[58] Field of Search .................................. 331/10, 11, 16, 331/17, 36 C, 117 R, 117 FE, 177 V, 167

[56] References Cited

U.S. PATENT DOCUMENTS

| | | | |
|---|---|---|---|
| 5,254,958 | 10/1993 | Flach et al. ................................. | 331/10 |
| 5,686,864 | 11/1997 | Martin et al. ............................ | 331/1 A |

FOREIGN PATENT DOCUMENTS 07202638  8/1995  Japan .

*Primary Examiner*—Siegfried H. Grimm
*Attorney, Agent, or Firm*—Long Aldridge & Norman, LLP

[57] ABSTRACT

A multi-band phase lock loop (PLL) device for use in a communication system. The PLL comprises a frequency reference oscillator, a reference frequency divider, a phase and frequency detector, a filter and compensation circuit, a microcontroller, a multi-band voltage controlled oscillator (VCO), and a feedback divider. A fast feedback signal is provided to the VCO for phase locking operation. A slow feedback signal is used by the microcontroller to generate a frequency adjust signal for frequency band centering for the VCO. The microcontroller also controls the VCO to change the frequency band of operation. The PLL device may be used in a communication system that operate in both the cellular frequency band and the PCS frequency band.

24 Claims, 9 Drawing Sheets

FREQUENCY BAND SELECT PHASE LOCK LOOP DEVICE

BACKGROUND OF THE INVENTION

1. Field of the Invention

This invention relates to a phase lock loop (PLL) device for a communication system, and in particular to a PLL device having frequency band selection and frequency band centering capabilities.

2. Discussion of the Related Art

Local oscillators are used in communications receivers for converting information signals to radio frequency (RF) and intermediate frequency (IF) signals. Conventional techniques for providing local oscillator (LO) signals use phase lock loop (PLL) designs including a voltage controlled oscillator (VCO) that are typically dedicated to generating LO signals at either a single frequency or over a narrow band of frequencies. Such narrow frequency bands are based on the frequency tuning range of varactor diodes within the VCO. Developments in communication technologies, such as the development in digital technology, have resulted in communication systems operating in widely separated frequency bands. For example, analog cellular systems (or AMPS, Advanced Mobil Phone Service) operate in frequency bands in the 800 MHz range, while personal communication service (PCS) systems operate in frequency bands in the 1900 MHz range. Thus, in communication devices that accommodate both AMPS and PCS systems, several LO signals in different and widely separate frequency bands are needed. Prior devices typically use a plurality of separate VCOs for generating LO signals falling in different frequency bands (e.g. U.S. Pat. No. 5,732,330 and 5,686,864). One prior device (U.S. Pat. No. 5,686,864) uses a variable VCO employing switchable parallel capacitors.

In conventional VCOs, the tunable frequency range is determined by the tunable capacitance range of the varactors in the VCO. The resonant frequency of the VCO circuit, however, is also influenced by the impedances of other circuit elements in the VCO. Thus, to ensure that the VCO can be tuned to desired frequencies, circuit elements in the VCO must be constructed to high precision (i.e. having small tolerances) or manually tuned so that the desired frequency is obtained while the varactor control voltage is as close as possible to the center of the tuning voltage range. This requires stringent manufacturing conditions, such as laser trimming, or post-adjustments of the circuit components after the circuits are constructed. These procedures are often costly and time-consuming. Further, these conditions require that the varactors have large capacitance tuning ranges to overcome tolerances in other circuit components. In addition, because the VCO may be required to lock to several different frequencies, at some of the frequencies, the varactors will be operating at control voltages that deviates from the center of their tuning voltage ranges. This again requires that the varactors have large tuning ranges. These problems are especially severe in multi-band VCOs since they involve additional circuit components that have to be built to high precision and post-adjusted.

SUMMARY OF THE INVENTION

Accordingly, the present invention is directed to a phase lock loop (PLL) device that substantially obviates one or more of the problems due to limitations and disadvantages of the related art.

It is an object of the present invention to provide a PLL device using a novel multi-band VCO having a simple structure with relatively few circuit components to accommodate multi-band operation.

It is another object of the present invention to provide a PLL device using a simple structure with the ability to expand the number of switchable bands.

It is a further object of the present invention to provide frequency band centering to obtain more precise tuning and to reduce the stringent requirements on manufacturing conditions and post-adjustments.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a multi-band phase lock loop (PLL) device is provided, comprising a frequency reference oscillator for providing a frequency reference signal, a reference frequency divider for dividing the reference frequency, a phase and frequency detector for generating an output error signal based on frequency and phase information contained in the frequency reference signal and a second input frequency signal, a filter and compensation circuit for generating a fast and a slow feedback signal based on the error signal, a microcontroller for generating a frequency adjust signal and a band select signal based on the slow feedback signal and a band select input, a multi-band voltage controlled oscillator (VCO) for generating an output frequency signal based on the fast feedback signal, the frequency adjust signal and the band select signal, and a feedback divider for dividing the frequency of the signal generated by the multi-band VCO to provide the second input frequency signal for the phase and frequency detector. The frequency of the VCO output signal falls within one of a plurality of frequency bands depending on the band select signal. Within each frequency band, the VCO output frequency is controlled by the fast feedback signal, and frequency band centering is accomplished by the frequency adjust signal provided by the microcontroller.

The multi-band VCO comprises a main resonant portion having at least one first varactor and a first inductor connected in parallel, and at least one parallel band-select portion having a second inductor and a second varactor that may be selectively connected into the circuit by a switch controlled by the band select signal. Specifically, the second inductors are selectively connected into the circuit in parallel with the first inductor by the band select signals to change the frequency band of the VCO output signal. When a particular frequency band is selected, appropriate second varactors are selectively connected into the circuit in parallel with the first varactor, and are voltage-controlled by the frequency adjust signal to accomplish frequency band centering.

It is to be understood that both the foregoing general description and the following detailed description are exemplary and explanatory and are intended to provide further explanation of the invention as claimed.

BRIEF DESCRIPTION OF THE DRAWING

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Reference will now be made in detail to the preferred embodiments of the present invention, examples of which are illustrated in the accompanying drawings.

Figure 9:
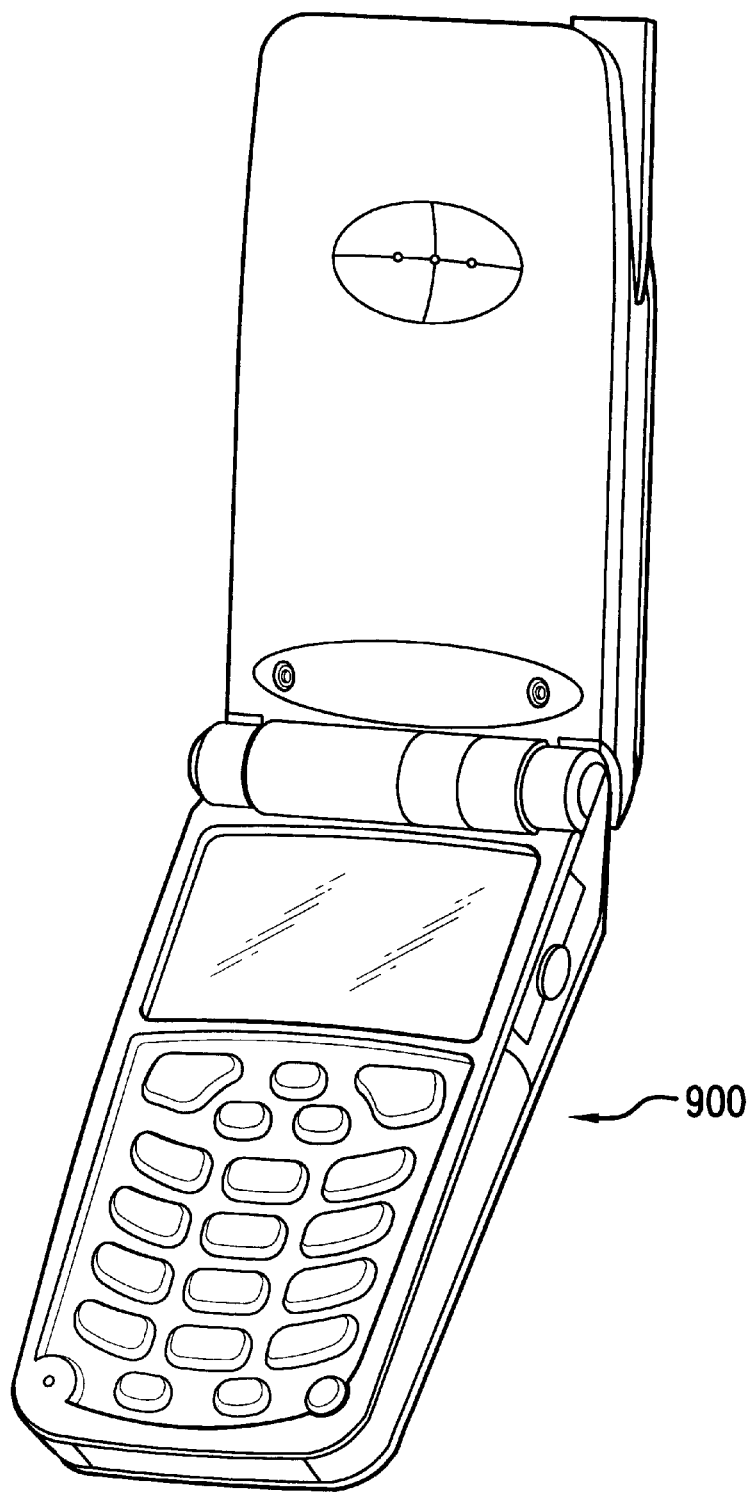
FIG. 9 illustrates a communication device in which embodiments of the present invention may be used.

FIG. 9 illustrates a communication device 900 in which embodiments of the present invention may be applied.

Figure 1:
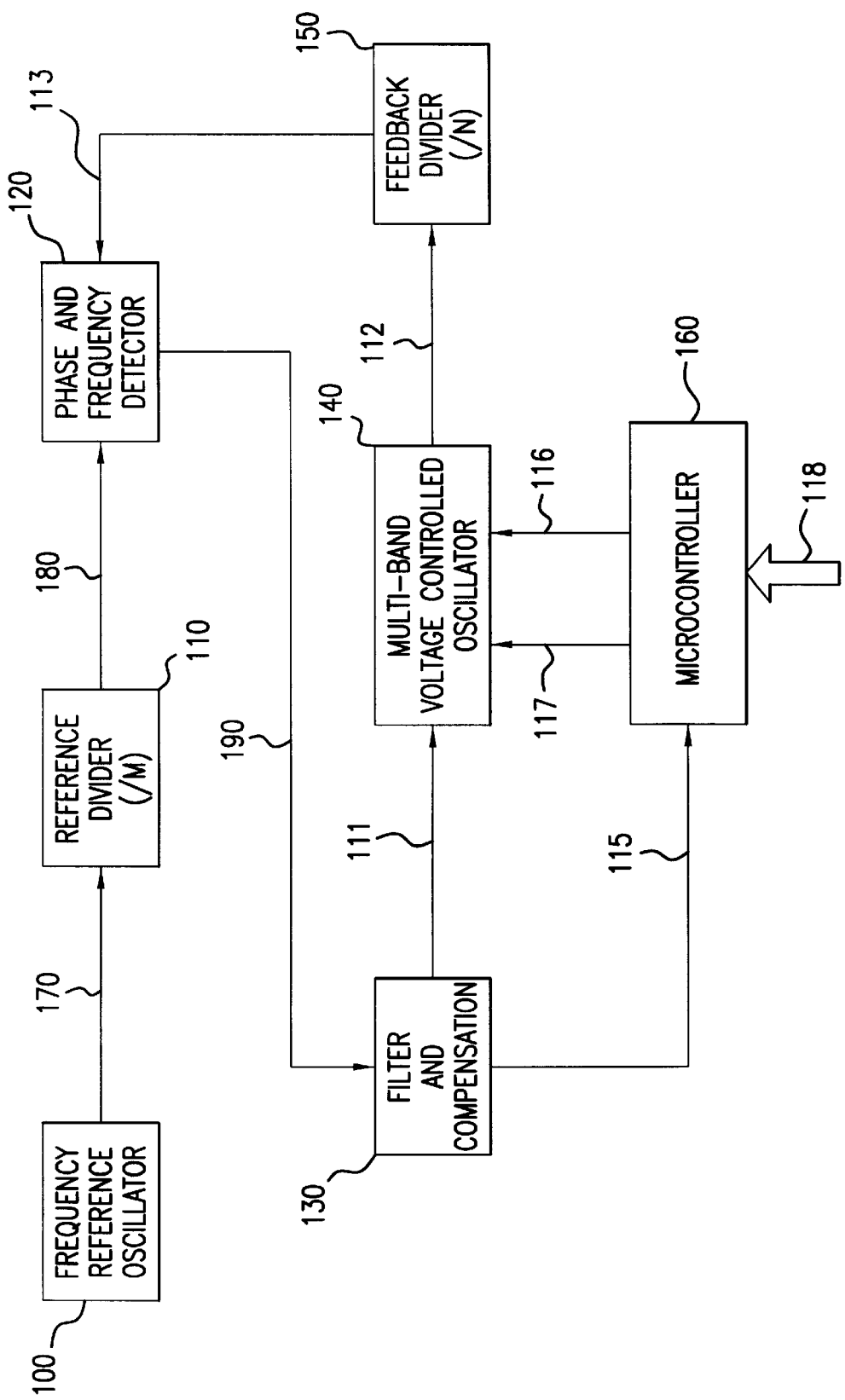
FIG. 1 is a block diagram showing a multi-band PLL according to an embodiment of the present invention.

Now referring to FIG. 1, a block diagram shows the components of a frequency band select phase look loop (PLL) according to a preferred embodiment of the present invention. A frequency reference oscillator 100 generates a reference frequency signal 170. The frequency reference oscillator 100 is typically a low phase noise component with high frequency accuracy, which may be further enhanced by temperature compensation and a frequency tunable input (not shown). The reference frequency signal 170 is input to a reference divider 110 which divides the frequency of its input signal by a value M to generate a frequency signal 180. The value for M may be programmable. The reference divider also provide phase noise reduction, and affects reference spur rejection and dynamic response in the feedback control system.

The frequency signal 180 is input as a first input signal into a phase and frequency detector 120, which also receives a second input signal 113 from a multi-band voltage controlled oscillator 140 through a feedback divider 150 to be described later. The phase and frequency detector 120 processes the two input signals 180 and 113 and generates an output error signal 190 representing the differences in frequency and phase between the two input signals. The output error signal 190 is input into a dual-output filter and compensation circuit 130, which filters and compensates the error signal 190 and generates a fast feedback signal 111 and a slow feedback signal 115.

The fast feedback signal 111 is coupled to a multi-band voltage controlled oscillator (VCO) 140. The multi-band VCO 140 generates an output signal 112 having a frequency determined by both the fast feedback signal 111 from the filter and compensation circuit 130, as well as band select signals 116 and frequency adjust signals 117 received from a microcontroller 160. The output signal 112 from the VCO 140 is input to a feedback divider 150, which divides the frequency of its input signal by a value N, and provides the divided frequency signal 113 to the phase and frequency detector 120 as its second input signal. The value for N may be programmable.

The phase and frequency detector 120, the filter and compensation circuit 130, the multi-band VCO 140 and the feedback divider 150 form a phase lock loop which operates to lock the frequency of the signal 113 to the frequency of the frequency-divided reference signal 180 to provide identical frequencies and a constant phase relationship between signals 180 and 113. The fast feedback signal 111 generated by the filter and compensation circuit 130 is thus the feedback signal for the phase lock loop. The use of the reference divider 110 and the feedback divider 150 is optional. When the dividers are used, the frequency of the output signal 112 of the VCO 140 is locked to the frequency of the frequency reference oscillator 100 by a ratio of N/M.

The slow feedback signal 115 generated by the filter and compensation circuit 130 is preferably slower-varying than the fast feedback signal 111 for the phase lock loop. The slow feedback signal 115 is provided to the microcontroller 160, which also receives band select inputs 118 from an external source (not shown). Based on the slow feedback signal 115 and the band select input 118, the microcontroller 160 generates a band select signal 116 for frequency band selection and a frequency adjust signal 117 for frequency band centering of the multi-band VCO 140.

Figure 2:
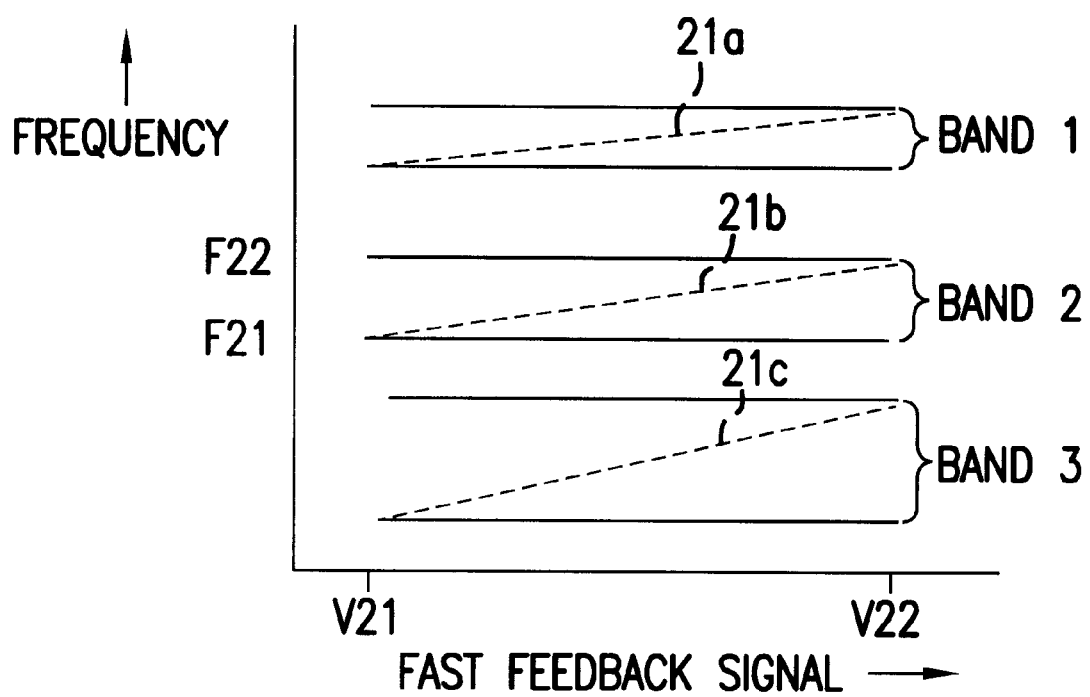
FIG. 2 illustrates the frequency bands of the multi-band PLL.

As illustrated in FIG. 2, the frequency of the VCO output signal 112 (the vertical axis) falls in a plurality of frequency bands such as Band 1, Band 2 and Band 3. These frequency bands may be disconnected (i.e. non-overlapping) bands. For example, one frequency band may be a band used by analog cellular phones (the 800 MHz band) and another band may be a band used by PCS (the 1900 MHz band). Alternatively, the bands may partially overlap (not shown) to provide phase lock operation over a single band covering a larger frequency range than any individual band. The band select signal 116 from the microcontroller 160 determines which frequency band the output signal 112 of the VCO 140 falls in. Within each frequency band, the frequency of the output signal 112 varies with the size of the fast feedback signal 111 (the horizontal axis) as indicated by the dashed lines 21a, 21b and 21c. For example, within Band 2, the VCO output frequency varies from F21 to F22 as the fast feedback signal 111 increases from V21 to V22. The phase lock loop formed by the phase and frequency detector 120, the filter and compensation circuit 130, the multi-band VCO 140 and the feedback divider 150 operates to lock the frequency of the VCO output signal 112 to a frequency within one of the frequency bands. Thus, by using the multi-band VCO 140, the frequency of the output signal 112 may be locked to an expanded range of frequencies. A precise frequency may be generated at each frequency band for use in a communication device, for example, as a local oscillator for down converting a received signal in a communication receiver.

Figure 3:
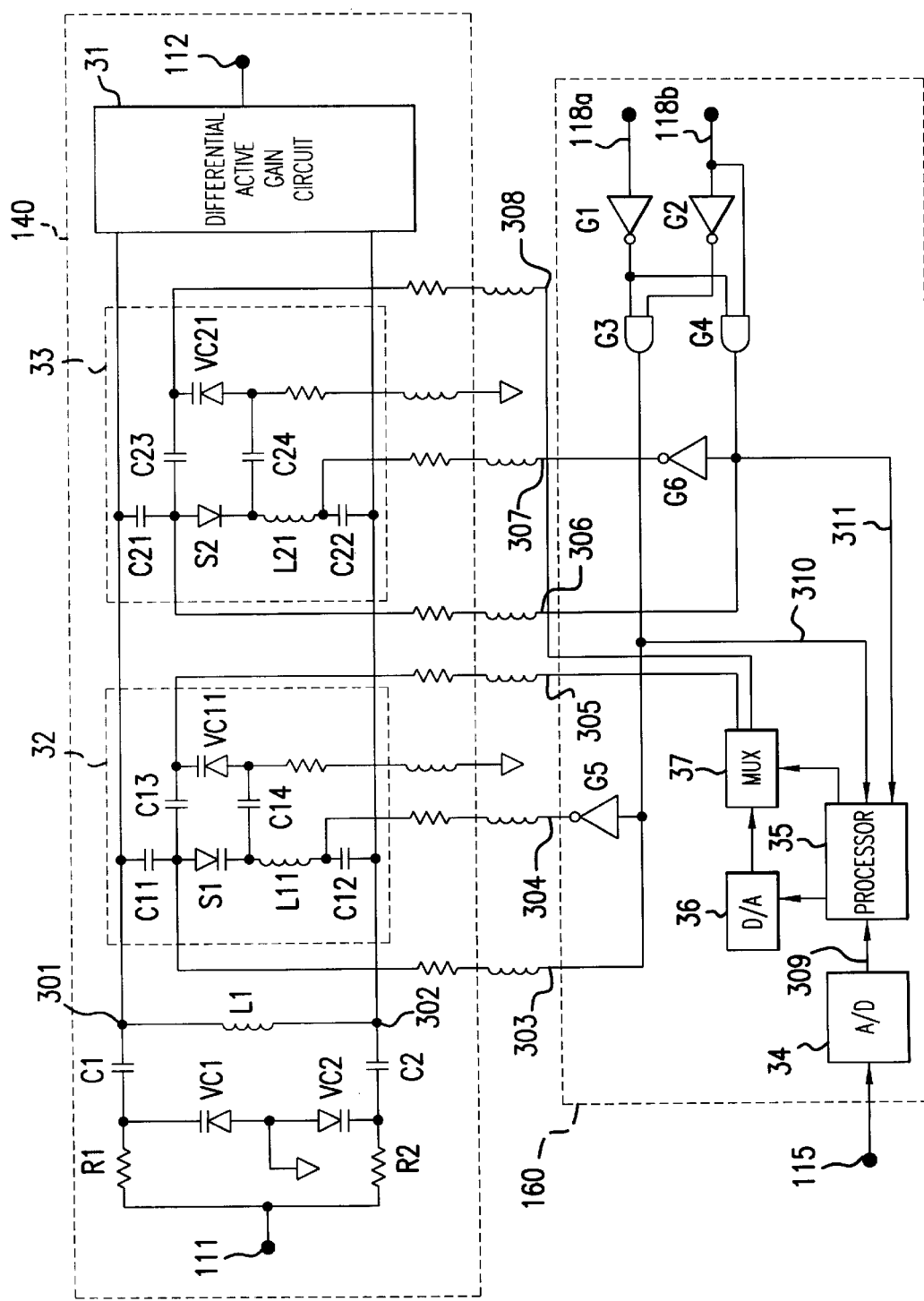
FIG. 3 is a schematic diagram illustrating a multi-band VCO and a microcontroller of the PLL according to an embodiment of the present invention.

FIG. 3 illustrates a three-band VCO 140 and a microcontroller 160 according to preferred embodiments of the present invention. The input terminal 111, the output terminal 112, and the input terminals 115 and 118a, 118b shown in FIG. 3 correspond to the identically designated lines shown in FIG. 1, respectively.

Two resistors R1 and R2, two voltage-variable capacitors or varactors VC1 and VC2, two capacitors C1 and C2 are connected in a balanced fashion as shown between nodes 301 and 302, with the input terminal 111 connected between the resistors R1 and R2 and an inductor L1 connected between the nodes 301 and 302. The resistors R1 and R2 are preferably equal in value, as are the capacitors C1 and C2. The resistors R1 and R2 connected to the input terminal 111 preferably have large values to prevent the circuit quality factor (Q) from being degraded and to provide isolation for the input tuning voltage 111. The varactors VC1 and VC2 are preferably equal in value and symmetrically placed. The fast feedback signal 111, which is typically a DC voltage, is therefore applied equally to the varactors VC1 and VC2. This varactor topology, referred to as the differential topology, reduces harmonic distortion and phase noise. The major portion of the capacitance, comprising the varactors VC1 and VC2 and the capacitors C1 and C2, is connected in parallel with the inductor L1 to form the main resonant portion for the multi-band VCO circuit 140. This main resonant portion is primarily responsible for determining the lowest frequency band of oscillation. As the tuning voltage value 111 increases, the capacitances of the varactors VC1 and VC2 decrease to cause the resonant frequency, or the variable frequency of the output signal 112 to increase. A differential active gain circuit 31 is connected between the nodes 301 and 302. At the terminals of the active gain circuit 31 connected to 301 and 302, a differential pair of transistors or other active devices (not shown) may be used to provide positive feedback and appropriate loop gain to sustain oscillation at the tuned resonant frequency. Either an integrated circuit or discrete devices may be used for the differential active gain circuit 31.

A capacitor C11, a switch S1, an inductor L11 and a capacitor C12 are connected in series between nodes 301 and 302. A varactor VC11 and two capacitors C13 and C14 are connected in series with each other and in parallel with the switch S1. The capacitors C11 and C12, the switch S1, the inductor L11, the varactor VC11, and the capacitors C13 and C14 form a first parallel band-select portion 32 of the multi-band VCO 140. The switch S1 is controlled by band select signals 303 and 304 provided by the microcontroller 160. In the illustrated embodiment, the switch S1 comprise a diode, which is open (non-conducting) when reverse-biased by the band select signals 303 and 304, and closed (conducting) when forward-biased by the same signals. A MOS transistor or other devices may alternatively be used as the switch, with corresponding modifications to the control circuitry as will be apparent to a skilled artisan.

Preferably, the impedance of the varactor VC11 is much larger than the combined series impedance of the capacitors C11, C12 and the inductor L11. In addition, the combined impedance of the capacitors C11 and C12 is preferably much smaller than that of the inductor L11. As a result, when the switch S1 is open and the varactor VC11 is connected in the circuit, the varactor VC11 is effectively placed in parallel with the inductor L1; and when the switch is closed and the varactor VC11 is shorted out, the inductor L11 is effectively placed in parallel with the inductor L1. The varactor VC11 is tuned by a frequency adjust signal 305 provided by the microcontroller 160. Appropriate resistors and inductors (high impedance chokes) may be provided on the signal lines 303, 304 and 305 to limit the current that activates the switch S1 and/or to limit loading on the tank circuit.

A second parallel band-select portion 33 comprising capacitors C21, C22, C23 and C24, a switch S2, an inductor L21, and a varactor VC21 is provided between the nodes 301 and 302. The second parallel band-select portion 33 has a structure identical to the first parallel band select portion 32 except that the corresponding components have different values. Band select signals 306 and 307, and a frequency adjust signal 308 from the microcontroller 160 are similarly provided.

The multi-band VCO configuration for the lowest frequency band is obtained when both switches S1 and S2 are open (non-conducting), connecting the varactor VC11 and VC21 in parallel with the inductor L1. When reconfiguring the multi-band VCO 140 for a higher frequency band, the switch S1 may be closed and the switch S2 opened by the band select signals 303, 304, 306 and 307 from the microcontroller 160. This bypasses the varactor VC11, and effectively places the inductor L11 into the circuit and in parallel with the inductor L1. As a result, the effective inductance of the circuit is reduced by the parallel combination of inductors L11 and L1, and the operating frequency of the VCO circuit is increased by a factor approximately equal to the square root of the inductor ratio L1/L11. The frequency may not follow the square root law exactly due to the elimination of VC11 from the circuit when the switch S1 is closed.

To reconfigure the multi-band VCO 140 for yet another frequency band, the switch S1 may be opened and the switch S2 may be closed by the band select signals 303, 304, 306 and 307 from the microcontroller 160. This causes the inductor L21 rather than L11 to be placed in parallel with the inductor L1. The inductor L21 has a different impedance value than L11, so that the VCO 140 is operating at a different frequency band. In this manner, the microcontroller 160 controls the frequency band selection of the VCO 140.

The band select signals 303, 304, 306 and 306 are generated by a decoding and band select portion of the microcontroller 160, which comprises a digital logic circuit including inverters G1, G2, G5 and G6 and AND gates G3 and G4 connected as shown in FIG. 3. The digital circuit decodes the logical band select inputs it receives at terminals 118a and 118b. For example, the lowest frequency band is selected by providing a logical "high" at the input line 118a and a logical "low" at the input line 118b to open (reverse bias) both switches S1 and S2. Similarly, the second frequency band is established by providing a logical "low" at both input lines 118a and 118b, and the third frequency band is established by providing a logical "low" to the input line 118a and a logical "high" to the input line 118b. Other decoding logic and band select inputs may be used so long as they provide the band select signals 303, 304, 306 and 307 to open and close the switches S1 and S2 as desired.

From the preceding description, it is seen that the intelligence provided by the microcontroller 160 in conjunction with the multi-band voltage controlled oscillator 140 and filter and compensation circuit 130 expands the number of frequency bands that can be phase locked without duplicating functions and circuits.

Frequency band centering, or the control operation for ensuring that the tuning varactors be operated near the center of their tuning voltage range, will now be explained. According to embodiments of the present invention, the VCO provides the capability to tune the parts of the VCO circuit other than the main tuning varactors VC1 and VC2, by a slow feedback signal, so that the main tuning varactors will always operate at or near the center of their tuning voltage range regardless of the locked frequency and the tolerances in other circuit components in the VCO. Frequency band centering alleviates the stringent requirements on the manufacturing process and eliminates the need for post-adjustment of the circuit components.

In the VCO circuit 140 of FIG. 3, frequency band centering is accomplished by varying the capacitance of either or both of the varactors VC11 and VC21 that are connected in the circuit (i.e. not shorted out) at a particular frequency band selection. This is accomplished by controlling the voltages applied to the varactors VC11 and VC21 at the control lines 305 and 308, respectively. In the three-band VCO 140 illustrated in FIG. 3, when the varactor VC11 is shorted out and VC21 is connected in the circuit (i.e. operating in the second frequency band), VC21 is tuned for frequency band centering. Similarly, the varactor VC11 is tuned for frequency band centering when operating in the third frequency band. When operating in the first or lowest frequency band, both varactors VC11 and VC21 are connected in the circuit and either or both may be tuned for frequency band centering. Since the impedances of the varactor VC11 and/or VC21 contribute to the determination of the VCO resonant frequency, the varactor VC11 and/or VC21 can be adjusted so that (1) the tuning voltages for the main tuning varactors VC1 and VC2 are within a predetermined range; and (2) the resonant frequency of the VCO is the desired frequency. The capacitance values of the varactors VC11 and VC21 are preferably smaller than the effective capacitance formed by the varactors VC1 and VC2 and the capacitors C1 and C2, so that they have a small effect on the tuning range of the varactors VC1 and VC2.

The control signals 305 and 308 are provided by the microcontroller 160 based on the slow feedback signal 115. The microcontroller 160 comprises an analog to digital converter 34, a processor 35, a digital to analog converter 36 and a multiplexer 37. The microcontroller 160 compares the slow feedback signal to programmed upper and lower limit voltage values, and adjusts the tuning voltage for the varactors VC11 and/or VC21 so that the level of the slow feedback signal 115 fall within the range between the upper and the lower limits. The slow feedback signal 115 is preferably configured to have approximately the same voltage level as the fast feedback signal 111. The processor 35 also receives signals 310 and 311 from the decoding and band select circuit (the output of gates G3 and G4), which contains information indicating which frequency band is selected. The MUX 37 distributes the frequency adjust signal to appropriate varactors in the VCO 140.

The frequency band select and frequency band centering operations of the microcontroller 160 is described with reference to the flow diagram shown in FIG. 4. In a step 401 after the process starts, the band select inputs 118a and 118b are monitored to determine the frequency band to be selected. If the band select inputs indicate that the frequency band selection has been changed (step 402), the microcontroller enables the appropriate varactor control voltage 305 and/or 308 via the multiplexer 37 (step 403), and close and/or open the appropriate switches S1 and S2, for example, via the gates G1–G6 (step 404). For example, if the band select inputs indicate the second frequency band is to be selected, the microcontroller causes the varactor VC11 in the VCO 140 to be shorted out and VC21 to be connected in the circuit, as well as enables the tuning voltage 308 across the varactor VC21. The process then returns to the step 401 to continue to monitor the band select inputs.

In step 402, if the band select input has not changed, the microcontroller compares the slow feedback signal 115 to a predetermined lower voltage limit Vmin (step 405). If the slow feedback signal 115 is not greater than the value Vmin, the control voltage across the enabled varactor is decreased (step 406). The process then returns to the step 401. If the slow feedback signal 115 is greater than the value Vmin, the microprocessor compares the slow feedback signal 115 to a predetermined upper limit value Vmax (step 407). If the slow feedback signal 115 is not less then the value Vmax, the control voltage across the enabled varactor is increased (step 408).

The process then returns to the step 401. If the slow feedback signal 115 is less than the value Vmax, the process is returned to the step 401. These steps are repeated.

By comparing the slow feedback signal to the limit values Vmin and Vmax (steps 405 and 407), and taking the appropriate action to decrease or increase the varactor control voltage (steps 406 and 408), a feedback loop (which may be referred to as the slow feedback loop) is formed to maintain the slow feedback signal within the predetermined range between Vmin and Vmax. Consequently, automatic frequency band centering is provided for the multi-band VCO 140. The limit values Vmax and Vmin are preferably programmable. In addition, the limit values may be different for different frequency bands.

Figure 4:
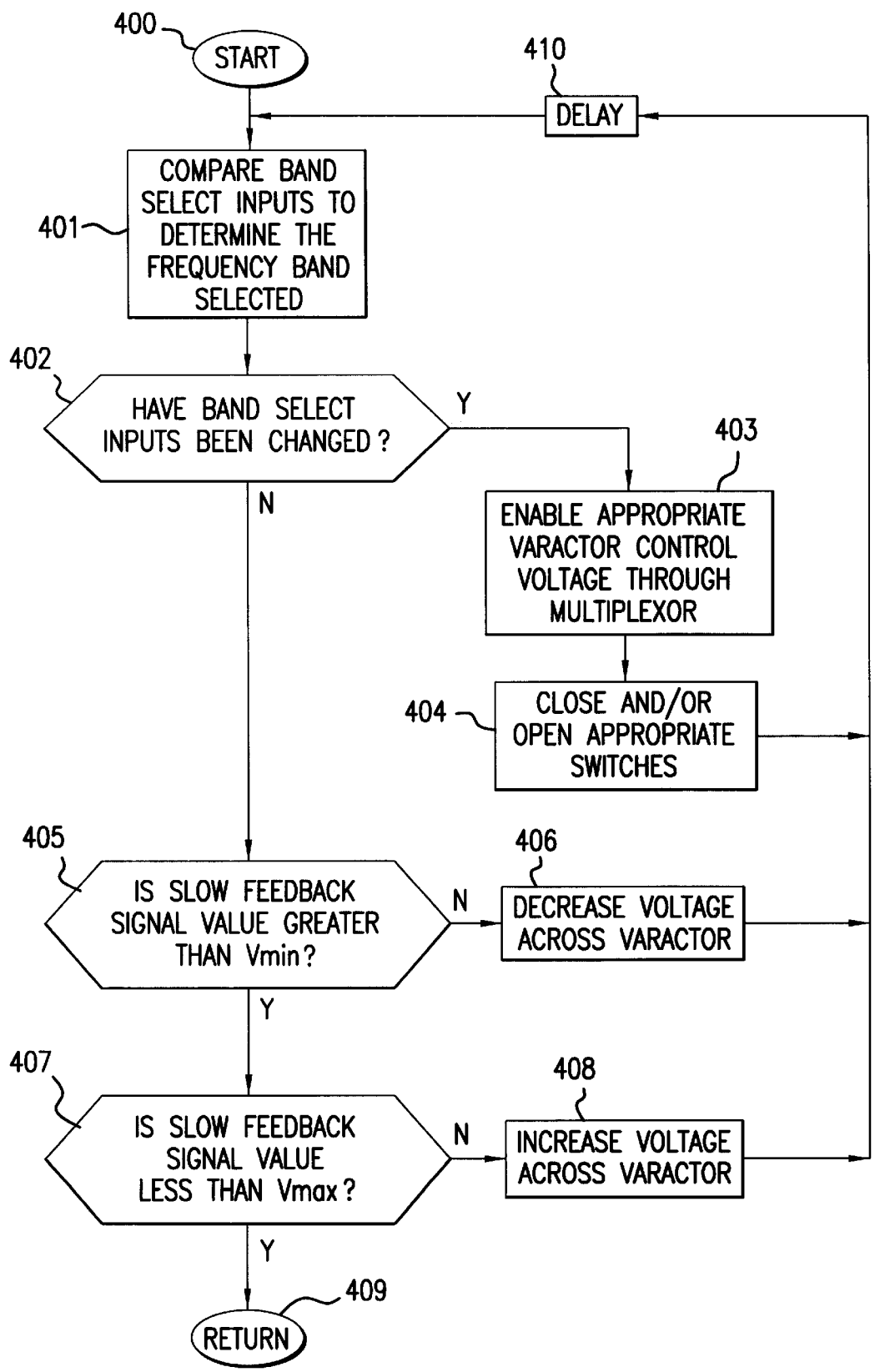
FIG. 4 is a flow diagram illustrating frequency band centering operations according to an embodiment of the present invention.

Still referring to FIG. 4, a delay (step 410) is preferably built into the microcontroller 160 when the control process returns from the switch closing/opening operation (step 404) and the varactor control voltage increasing/deceasing operations (steps 406 and 408) to the step 401. The delay causes the processing of the slow feedback signal 115 to be applied at a reduced rate so as not to affect or interact with the fast feedback operation of the VCO 140 based on the fast feedback signal 111, which operates to lock the frequency of the VCO to the reference frequency via the phase lock loop. The delay is preferably programmable, and it may be omitted entirely.

Although frequency band centering is described in the context of multi-band VCOs, it should be readily apparent to a skilled artisan that it may be performed independently of band select operations, and frequency band centering techniques described herein may be applied in single-band VCOs as well.

Although the embodiment of the multi-band VCO 140 illustrated in FIG. 3 includes two parallel band select circuits 32 and 33 (making it a three-band VCO), more or fewer parallel circuits may be used, depending on the desired number of frequency bands. For example, if only one parallel circuit is used, the multi-band VCO is a two-band VCO. In addition, when two or more parallel band select circuits are used, any number or combination of parallel varactors (i.e. the varactors in the parallel circuits that correspond to the varactor VC11 in the first parallel circuit) may be connected in the circuit (i.e. not shorted out). Preferably, at least one parallel varactor is connected in the circuit to provide frequency band centering. Preferably, no more than two parallel varactors are connected in the circuit to reduce interaction with the varactors VC1 and VC2 in the main resonant portion. The microcontroller 160 determines which one or combination of the parallel varactors may be used for frequency band centering. When the number of parallel band select circuits provided in the VCO 140 is other than two, appropriate changes are needed in the microcontroller 160 as will be apparent to a skilled artisan.

Figure 5:
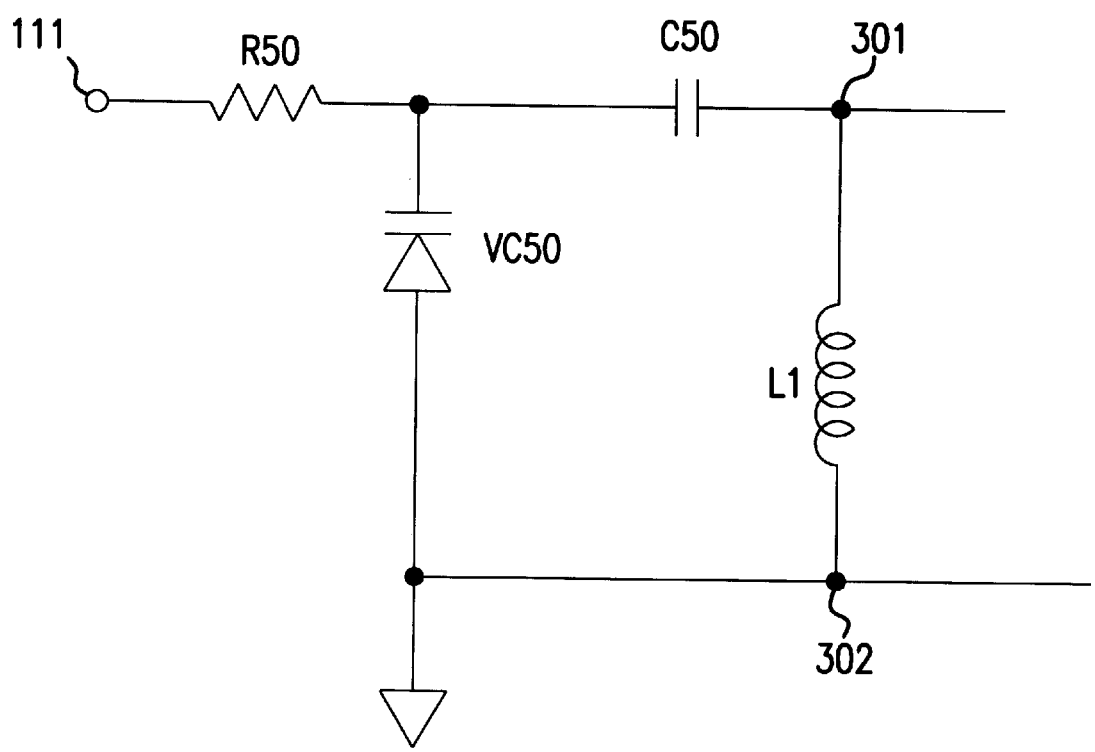
FIG. 5 is a schematic diagram showing an alternative embodiment of a portion of the multi-band VCO.

In the embodiment shown in FIG. 3, the main resonant portion of the multi-band VCO 140, formed by the varactors VC1 and VC2 and the capacitors C1 and C2, and the inductor L1, has a balanced differential topology. Alternatively, a single-ended topology may also be used, as shown in FIG. 5. The nodes 111, 301 and 302 in FIG. 5 correspond to the identically designated nodes in FIG. 3. Instead of two resistors, two capacitors and two varactors, a single resister R50, a single varactor VC50 and a single capacitor C50 are now used to form the main resonant portion which is primarily responsible for determining the frequency of the lowest frequency band of the VCO 140.

Figure 6A:
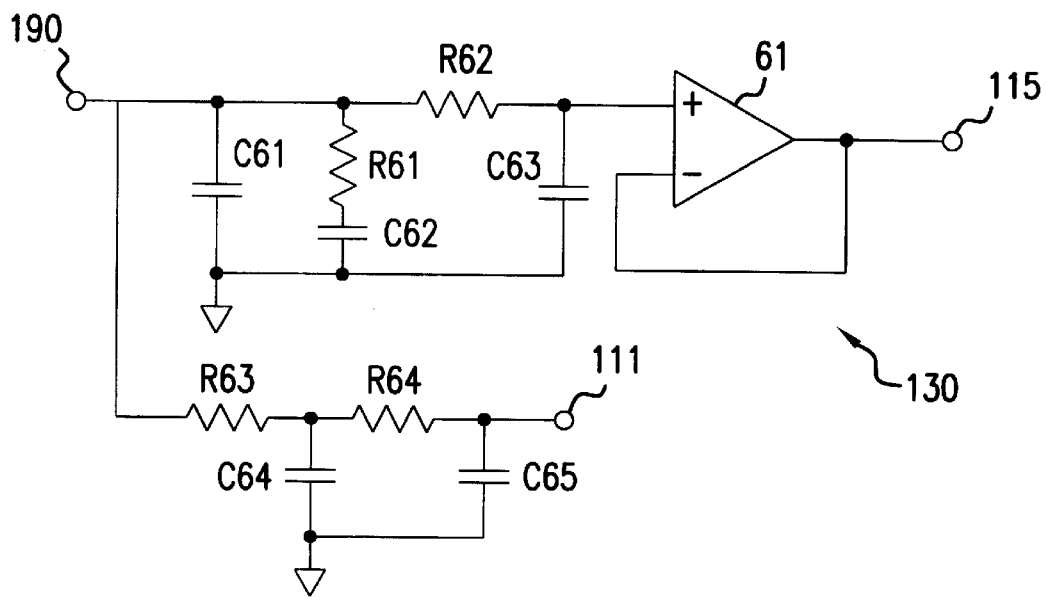
FIGS. 6A and 6B are schematic diagrams showing a filter and compensation circuit according to embodiments of the present invention.
Figure 6B:
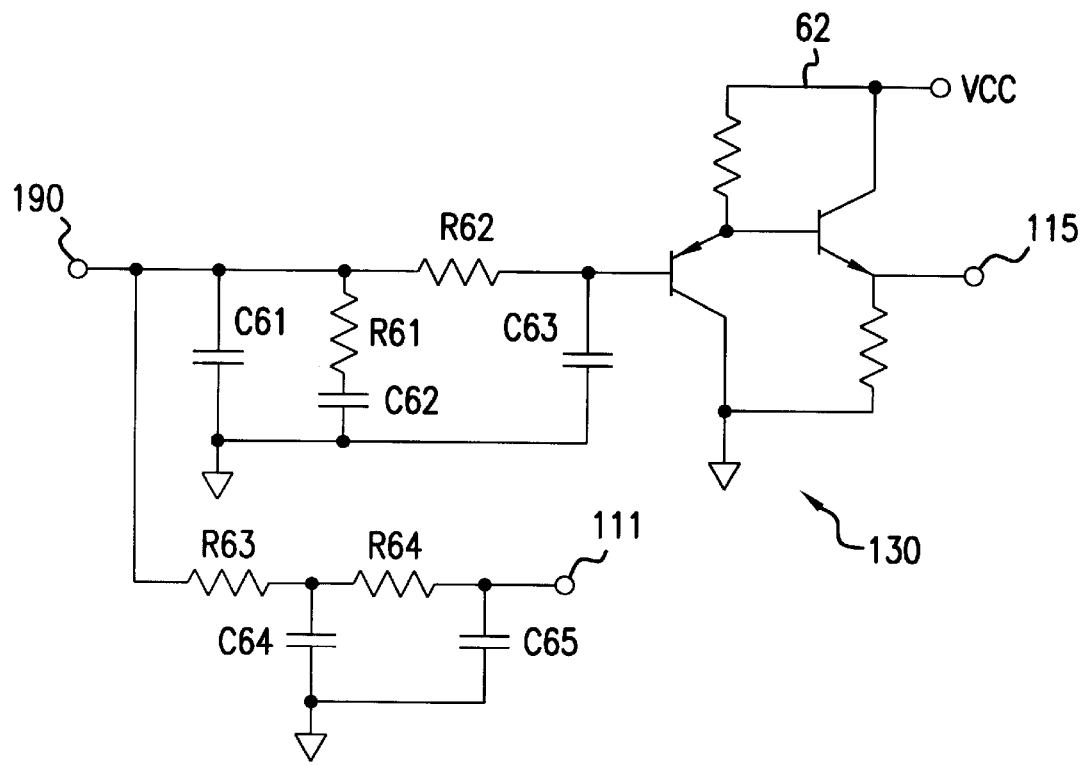

FIGS. 6A and 6B illustrate two alternative structures of the filter and compensation circuit 130 according to preferred embodiments of the present invention. In both figures, the input terminals 190 and the output terminals 115 and 111 correspond to the identically designated signal lines in FIG. 1. The terminal 190 receives the error signal from the phase and frequency detector 120, the terminal 111 provides the fast feedback signal to the multi-band VCO 140 for phase lock operation, and the terminal 115 provides the slow feedback signal to the microcontroller 160 for frequency band centering.

The filter and compensation circuit 130 shown in FIG. 6A employs a unity gain operational amplifier 61 as a buffer and isolator to avoid interaction between the fast feedback signal 111 and the slow feedback signal 115, while the circuit shown in FIG. 6B employs a two-transistor buffer with unity gain 62 instead of an operational amplifier as the buffer and isolator. Both amplifier-buffer devices in FIGS. 6A and 6B have large input impedance at frequencies within the PLL loop bandwidth and prevent loading and interaction between the fast and slow feedback signals. The two structures of FIGS. 6A and 6B are otherwise identical. In these circuits, capacitors C61 and C62 and a resistor R61 form a filter that is commonly used in conventional PLL circuits. A resistor R62 and a capacitor C63 form an additional filter. Preferably, the resistance of R62 is chosen to be much greater than the impedance formed by the capacitor C61 in parallel with the series combination of the resistor R61 and the capacitor C62. In addition, the capacitor C63 preferably has a capacitance value close to that of the capacitor C62 for better filtering effects. Resistors R63 and R64 and capacitors C64 and C65 form high frequency filters used for high frequency spurious signal rejection and for filtering out high frequency noise that could modulate the multi-band VCO's output.

Figure 7:
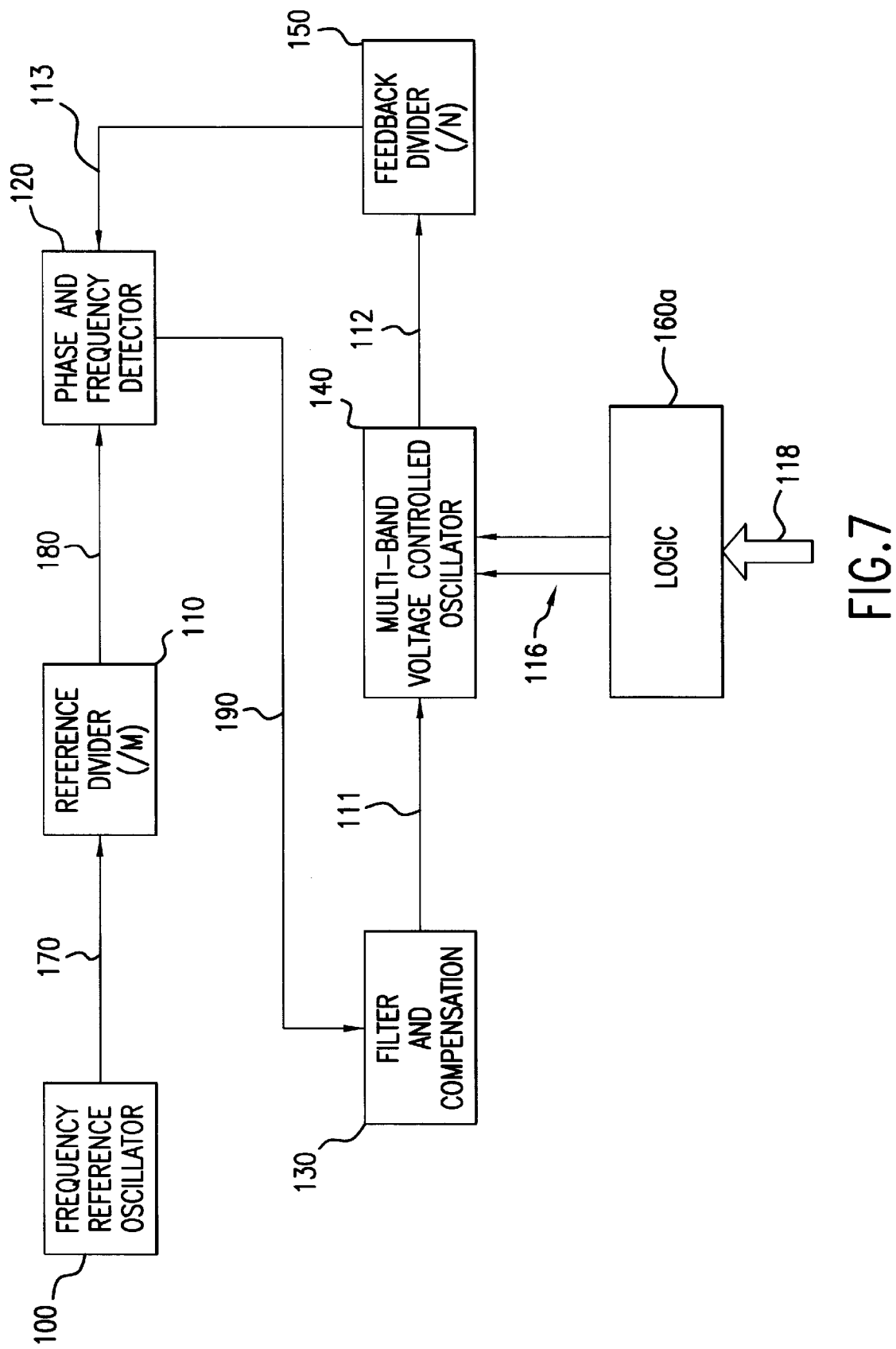
FIG. 7 is a block diagram showing a multi-band PLL according to another embodiment of the present invention.

FIG. 7 shows an alternative band select PLL device according to another embodiment of the present invention in which the frequency band centering capabilities are omitted. The structure of the system of FIG. 7 is identical to that of FIG. 1 except that the slow feedback signal 115 from the filter and compensation circuit 130 to the microcontroller 160 is now eliminated. The structure of the filter and compensation circuit 130 may be simplified accordingly. For example, the amplifier/buffer structure and the low pass filter formed by the resistor R62 and capacitor C63 shown in FIGS. 6A and 6B may be omitted. In addition, the microcontroller 160 in FIG. 1 may be replaced by logic 160a in FIG. 7 which performs the frequency band select functions.

Figure 8:
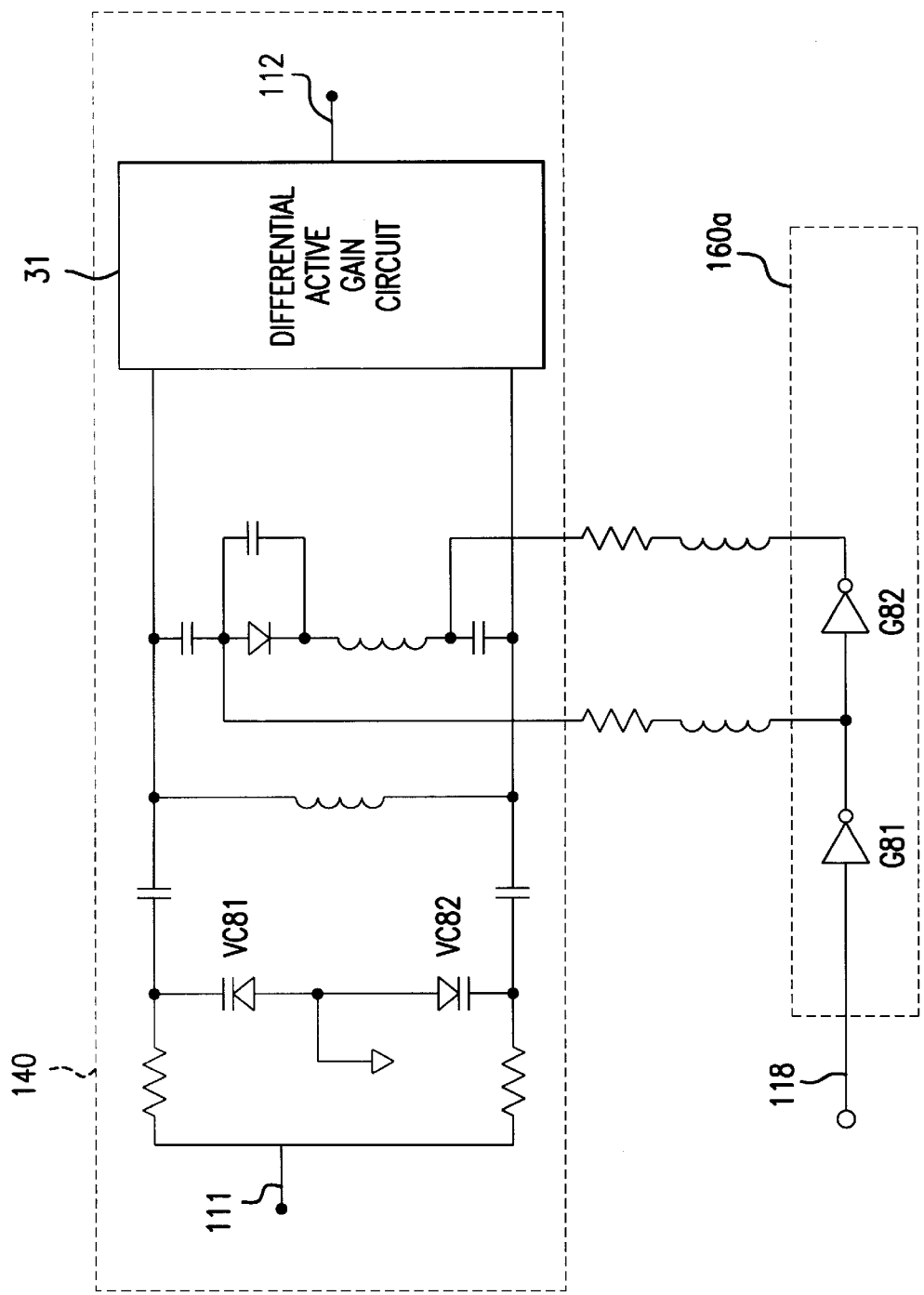
FIG. 8 is a schematic diagram illustrating a multi-band VCO and control logic for the PLL according to another embodiment of the present invention.

FIG. 8 illustrates a multi-band VCO 140 and logic 160a suitable for use in the phase lock loop of FIG. 7. This embodiment has a simplified structure including a two-band VCO 140 having a single parallel band select circuit, and logic 160a having two inverters (G81 and G82) for band select operation. The two frequency bands may be, for example, the analog cellular band (800 MHz) and the PCS band (1900 MHz), respectively. This structure provides no frequency band centering capabilities; instead, tolerance control, and main varactor tuning (of VC81 and VC82) are used to provide multi-band frequency control. This simplified structure reduces the number of components, power consumption, size, and cost of the communication devices in which it is applied.

It will be apparent to those skilled in the art that various modifications and variation can be made in the multi-band PLL of the present invention, such as variations in impedance levels, varactor impedances, component switching strategies, and circuit topologies, without departing from the spirit or scope of the invention. Thus, it is intended that the present invention cover the modifications and variations of this invention that come within the scope of the appended claims and their equivalents.

What is claimed is:

1. A phase lock loop (PLL) device, comprising:
a phase and frequency detector coupled to a frequency reference signal having a first frequency and to a second input frequency signal for generating an output error signal based on frequency and phase information contained in the frequency reference signal and the second input frequency signal;
a filter and compensation circuit coupled to the output error signal of the phase and frequency detector, the filter and compensation circuit including a first low-pass filter for generating a first feedback signal, and a second low-pass filter for generating a second feedback signal based on the error signal;
a controller coupled to the second feedback signal for generating a frequency adjust signal; and
a voltage controlled oscillator (VCO) coupled to the first feedback signal and to the frequency adjust signal for generating an output frequency signal to be provided to the phase and frequency detector as its second input frequency signal, the output frequency signal having a second frequency which is controlled by both the first feedback signal and the frequency adjust signal;
whereby the phase and frequency detector, the filter and compensation circuit and the voltage controlled oscillator form a phase lock loop to lock the second frequency to the first frequency.

2. The PLL device of claim 1, wherein the VCO comprises a first and a second varactor, the first varactor being controlled by the first feedback signal and the second varactor being controlled by the frequency adjust signal, and wherein the second frequency depends on the capacitance of both the first and the second varactor.

3. The PLL device of claim 2, wherein the first and second varactors are connected in parallel.

4. The PLL device of claim 2, wherein the second feedback signal is slower-varying than the first feedback signal.

5. The PLL device of claim 1, wherein the controller generates the frequency adjust signal based on the second feedback signal so that the second feedback signal falls within a predetermined voltage range.

6. The PLL device of claim 5, wherein the frequency adjust signal is a DC voltage, and wherein the controller changes the DC voltage in a first direction if it determines that the second feedback signal is higher than a predetermined upper limit value, changes the DC voltage in a second direction if it determines that the second feedback signal is lower than a predetermined lower limit value, and otherwise leaves the DC voltage unchanged.

7. The PLL device of claim 6, wherein the processor repeats the determining and changing steps, and delays for a predetermined period of time after a changing step before the next determining step.

8. The PLL device of claim 7, wherein the period of delay is zero.

9. The PLL device of claim 5, wherein the VCO comprises a first varactor coupled to the first feedback signal and a second varactor coupled to the frequency adjust signal.

10. The PLL device of claim 1, wherein the filter and compensation circuit further comprises a buffer for preventing interaction between the first and second feedback signals.

11. A phase lock loop (PLL) device, comprising:
a phase and frequency detector coupled to a frequency reference signal having a first frequency and to a second input frequency signal for generating an output error signal based on frequency and phase information contained in the frequency reference signal and the second input frequency signal;
a filter and compensation circuit coupled to the output error signal of the phase and frequency detector for generating a first and a second feedback signal based on the error signal;
a controller coupled to the second feedback signal and to a band select input for generating a frequency adjust signal and a band select signal; and
a voltage controlled oscillator (VCO) coupled to the first feedback signal, the band select signal, and the frequency adjust signal for generating an output frequency signal having a second frequency to be provided to the phase and frequency detector as its second input frequency signal, the VCO comprising at least one first varactor controlled by the feedback signal, a first inductor connected in parallel with the first varactor, at least one second inductor selectively connected to the first varactor and the first inductor by the band select signal, and at least one second varactor controlled by the frequency adjust signal and selectively connected to the first varactor and the first inductor by the band select signal;
whereby the phase and frequency detector, the filter and compensation circuit and the VCO form a phase lock loop to lock the second frequency to the first frequency.

12. The PLL device of claim 11, wherein the second frequency falls within one of a plurality of frequency bands dependent upon the connection of the second inductor controlled by the band select signal, and wherein the value of the second frequency within a frequency band is controlled by the first feedback signal and the frequency adjust signal.

13. The PLL device of claim 11, wherein the controller generates the frequency adjust signal based on the second feedback signal so that the second feedback signal falls within a predetermined voltage range.

14. A method of generating a phase locked frequency signal, comprising:
providing a voltage controlled frequency signal having a second frequency using a voltage controlled oscillator (VCO), the VCO comprising at least one first varactor and at least one second varactor connected to the first varactor, the second frequency being dependant on both the first and second varactors;
detecting the frequency and phase information contained in the voltage controlled frequency signal and a frequency reference signal having a first frequency to generate an output error signal based on the detected information;
passing the error signal through a filter and compensation circuit comprising a first low-pass filter to provide a first feedback signal and a second low pass filter to provide a second feedback signal;
controlling the first varactor in the VCO using the first feedback signal to vary the second frequency;
generating a frequency adjust signal based on the second feedback signal; and
controlling the capacitance of the second varactor using the frequency adjust signal.

15. The method of claim 14, wherein the first and second varactors are connected in parallel.

16. The method of claim 14, wherein the second feedback signal is slower-varying than the first feedback signal.

17. The method of claim 14, wherein the frequency adjust signal is generated by comparing the second feedback signal to predetermined upper and lower limit values.

18. The method of claim 17, wherein the frequency adjust signal is a DC voltage, and wherein when generating the frequency adjust signal, the DC voltage is changed in a first direction if the second feedback signal is higher than the upper limit value, changed in a second direction if the second feedback signal is lower than the lower limit value, and otherwise unchanged.

19. The method of claim 18, wherein the changing step is repeated after a delay or a predetermined time period.

20. The method of claim 19, wherein the period of delay is zero.

21. The method of claim 14, wherein the filter and compensation circuit prevents interaction between the first and second feedback signals.

22. A method of generating a band-selectable phase locked frequency signal, comprising:
providing a voltage controlled frequency signal having a second frequency using a voltage controlled oscillator (VCO), the VCO comprising at least one first varactor and a first inductor connected in parallel;
detecting the frequency and phase information contained in the voltage controlled frequency signal and a frequency reference signal having a first frequency to generate an output error signal based on the detected information;
processing the error signal to provide a first and a second feedback signal;
controlling the first varactor in the VCO using the first feedback signal to vary the second frequency;
providing a band select signal;
selectively connecting or disconnecting at least one second inductor to the first varactor and the first inductor in the VCO based on the band select signal to change the second frequency;
generating a frequency adjust signal based on the second feedback signal; and
selectively connecting or disconnecting at least one second varactor to the first varactor and the first inductor in the VCO based on the band select signal; and
controlling the capacitance of the second varactor connected to the first varactor and the first inductor using the frequency adjust signal.

23. The method of claim 22, wherein the second frequency falls within one of a plurality of frequency bands dependent upon the connection of the second inductor controlled by the band select signal, and wherein the value of the second frequency within a frequency band is a controlled by the first feedback signal and the frequency adjust signal.

24. The method of claim 22, wherein the frequency adjust signal is generated based on the second feedback signal so that the second feedback signal falls within a predetermined voltage range.

* * * * *